(12) United States Patent
Paul

(10) Patent No.: US 8,487,635 B1
(45) Date of Patent: Jul. 16, 2013

(54) SYSTEM AND METHOD FOR DETERMINING SYSTEM CHARGING CURRENT

(76) Inventor: Dev Paul, Richmond, CA (US)

( * ) Notice: Subject to any disclaimer, the term of this patent is extended or adjusted under 35 U.S.C. 154(b) by 0 days.

(21) Appl. No.: 13/312,092

(22) Filed: Dec. 6, 2011

Related U.S. Application Data

(60) Provisional application No. 61/421,042, filed on Dec. 8, 2010.

(51) Int. Cl.
*G01R 31/08* (2006.01)
*H02H 9/08* (2006.01)

(52) U.S. Cl.
USPC .................. 324/536; 324/522; 361/48

(58) Field of Classification Search
USPC .......... 324/76.11, 522, 512, 500, 509, 536, 324/541, 544, 547, 410, 411, 678; 361/62–64, 361/1, 2, 12, 155, 156, 14, 134
See application file for complete search history.

(56) References Cited

U.S. PATENT DOCUMENTS

| | | | |
|---|---|---|---|
| 3,771,020 A * | 11/1973 | Smith | 361/48 |
| 3,852,641 A * | 12/1974 | Titus | 361/47 |
| 3,913,010 A * | 10/1975 | Scarpino | 324/509 |
| 4,589,050 A * | 5/1986 | Cutler et al. | 361/86 |
| 5,793,593 A * | 8/1998 | Reed et al. | 361/93.4 |
| 7,180,300 B2 * | 2/2007 | Premerlani et al. | 324/512 |
| 2007/0182361 A1 * | 8/2007 | Pande et al. | 318/812 |
| 2010/0213952 A1 | 8/2010 | Locker | |

* cited by examiner

*Primary Examiner* — Hoai-An D Nguyen
(74) *Attorney, Agent, or Firm* — Eric Karich

(57) ABSTRACT

A system for determining a system charging current in a three-phase power system has a first grounding circuit that joins a neutral of the power transformer with a ground through a first resistor. System charged capacitance voltage in one phase is discharged through a second resistor in a second grounding circuit joining the one phase of the power system with the ground. A magnitude of the currents in the first and second grounding circuits are measured when the one phase is short circuited to ground. The preliminary system charging current is calculated as the root of the difference between the squares of the measured currents grounding circuits. The same procedure may be repeated for different values of the first resistor and for each of the phases, and the calculated preliminary system charging currents may be averaged to arrive at a net system charging current.

9 Claims, 2 Drawing Sheets

SYSTEM AND METHOD FOR DETERMINING SYSTEM CHARGING CURRENT

CROSS-REFERENCE TO RELATED APPLICATIONS

This application for utility patent claims the benefit of provisional patent application Ser. No. 61/421,042, filed on Dec. 8, 2010.

STATEMENT REGARDING FEDERALLY SPONSORED RESEARCH OR DEVELOPMENT

Not Applicable

BACKGROUND OF THE DISCLOSURE

This disclosure relates to the field of three-phase electrical power systems and more particularly to an apparatus and method for determining the inherent system charging current of the system. Electrical arc hazards and associated affects on electrical equipment are unpredictable. Arcs may occur when equipment insulation between phase-to-phase or phase-to-ground fails. The intensity of arc damage is related to fault current magnitude at insulation failure. Power system faults data indicate that close to 75% of all faults involve ground. From this data it is clear that making the ground fault current low by using a resistance grounded power system can minimize the problem of arc hazard. The inherent system charging current value should be known for designing a high resistance (HR) grounded power system which will have lowest line-ground fault current and at the same time will avoid the occurrence of transient over voltages during such faults. There are other techniques that have been suggested by industry; however, in each case precautions need to be taken as measurements are conducted on live energized equipment. Clearly a novel measuring system for charging current is needed which does not pose a danger as compared to methods currently in use and well known. The following describes some of the contemporary techniques for determining system charging current.

In one method engineering calculations can be performed involving the inherent capacitance to ground for each of the power system components. However, this method may not provide accurate data as the sneak capacitance to ground of power system components due to their installation configuration cannot be determined.

Another approach is to use a low voltage isolated variable 120 V source voltage at the transformer neutral. This method requires that the entire power system be energized by closing the secondary breaker and keeping a fused load-interrupter switch open. The no load interrupter switch should have a bolted connection at the transformer neutral connection using an appropriate insulating boot to assure there is no arc when suddenly the load interrupter switch is closed. Initially, there should be no voltage in the bolted transformer neutral circuit when the fused load-interrupter switch is suddenly closed as the auto-transformer secondary is kept at zero volts. Then the secondary voltage of the auto-transformer is gradually increased by carefully moving the potentiometer such that there is some voltage and associated current reading. This method requires several recordings of both voltage and current to determine the constant relationship between voltage and current, which may pose danger to low voltage equipment due to the presence of medium voltage as the system is fully energized. This method poses a danger both to equipment and to personnel during measurements, and it is uncertain how the power system voltage regulation and dynamic nature of the energized power system at the time of making measurements would affect the foreign low voltage when power system voltage is present.

A further approach is to keep transformer neutral ungrounded and use a bolted connection of one phase-ground with a variable resistor and measure system charging current when the variable resistance becomes practically zero representing a bolted fault-to-ground fault on one phase. Then, using a sensitive ammeter, the direct current reading provides the system charging current. This method appears to work on the theory that when a bolted line-to-ground fault occurs on an ungrounded power system, the total system charging current will flow through the faulted phase-to-ground, and will then return to the power source through the other two phases. However, it is possible that the inductive reactance of the faulted phase conductor in series with the capacitive reactance of the un-faulted phases may develop series resonance causing dynamic over-voltage and equipment damage. Therefore, this method may pose a danger to both the equipment as well as personnel because the variable resistor needs to be changed gradually and carefully as the full line-neutral system voltage appears on the variable resistor. Changes in resistance may cause dangerous arcing on un-faulted phases as they will be at line-line voltage, especially in case of a medium voltage power system with considerable system charging current. As the system is ungrounded, dangerous transient over-voltages may occur on the ungrounded phases and cause damage.

Another approach keeps transformer neutral ungrounded and uses a bolted connection of one phase-ground to ground with a fixed resistor and a contactor to short the resistor remotely to make a bolted fault to ground and record system charging current by using a sensitive ammeter when the resistor is short circuited. This method has been discussed in the industry, but has the same drawbacks as indicated above. This is an improved method, as remote operation of the switching device, such as a contactor rated for line-to-line system voltage, can provide a short across the resistor to simulate a bolted line-to-ground fault to make direct recording of the system charging current possible. This method is again based upon the assumption that if a bolted line-to-ground fault occurs on an ungrounded power system, then the fault current will be equal to system charging current as there is no other connection of system to ground other than the capacitive coupling of the phases to ground. Again, it should be noted that this is an ungrounded power system which may cause dangerous transient over-voltages on the phases not under test when the resistor in the phase under test is short circuited due to arcing caused by system voltage regulation.

BRIEF SUMMARY OF THE DISCLOSURE

The present disclosure describes an apparatus and method for determining system charging current in a three-phase power system. This method provides the best assurance of avoiding dangerous transient over-voltages in a medium voltage power system, because the system is kept grounded through a suitable neutral resistor. All neutral resistor values will provide ratio ($I_F/I_R$) equal to or less than 1.414 but greater than 1.275 will be suitable resistors for HR grounded power system. The apparatus may include a capacitance discharging disconnect switch, a fused interrupter switch with a current limiting fuse, capable of remote operation, a fixed resistor with a parallel contactor contact, capable of remote closure, sensitive clamp on type current transformers capable of providing input to a system charging current recorder. A direct recorder is capable of operating with two current inputs, $I_R$ and $I_F$. It is a smart package capable of making engineering calculations based on a simple equation, providing $I_F/I_R$ ratio for suitable neutral resistor tap as well being capable of calculating the average of several calculated values of the system charging current which may be stored in memory (data storage unit) during measurements. A micro-processor ground fault protection relay is provided for monitoring the neutral resistor current accurately. In addition, this relay does not need to provide tripping of the secondary breaker but provides an alarm at a set current pickup. A similar relay may be used in a phase-to-ground circuit. Then, a recording can be made of the fault current through the phase conductor when grounded without any resistance in the circuit. This current $I_F$ is the vector sum of $I_R$ (current through the neutral resistor which is $E_{L-N}/R_N$) and total system charging current $I_c$. Finally the expression $I_c = \sqrt{(I_F^2 - I_R^2)}$ is used to determine the inherent system charging current. The method of determining system charging current in a high resistance grounded power system is preferably to take three sets of readings by changing the resistor tap or by other resistance variation. The entire system is de-energized, cable capacitance discharged through a grounding switch and then the system is re-energized to take measurements at different resistor values. It is not expected that the system charging current will change much between the several determinations. The average of multiple calculated system charging currents should provide a confident value. Please note that, with, let's say, three taps on the neutral resistor, $I_R$ should be greater than $I_C$ at each tap. If there are concerns of unequal capacitances among each of the phases to ground, then measurements can be performed using each phase in turn, in producing bolted ground fault current. This will provide a total of nine readings of the system charging current. The average value of the nine readings will be the system charging current. A direct recorder needs two current inputs from current transformers, one for fault current $I_F$ and the other a neutral resistor current $I_R$, and a DC power supply input from and an external 120V AC to DC charger. A unit consisting of a central processing unit and associated components makes a direct calculation using the two current inputs to find system charging current using the equation $I_C = \sqrt{(I_F^2 - I_R^2)}$. This direct recorder as a fully integrated micro-processor unit capable of making necessary computations of system charging current. The unit may be a complete portable unit with a built in DC power supply capable of charging from an external battery charger with surge protection for protecting its internal components from power system transients encountered during current inputs. If several readings are taken on different phases or by use of the different neutral resistor taps described earlier, then the average of those several readings may be computed by the same unit.

The details of one or more embodiments of these concepts are set forth in the accompanying drawings and the description below. Other features, objects, and advantages of these concepts will be apparent from the description and drawings, and from the claims.

BRIEF DESCRIPTION OF THE SEVERAL VIEWS OF THE DRAWING

Like reference symbols in the various drawings indicate like elements.

DETAILED DESCRIPTION OF THE DISCLOSURE

Figure 1:
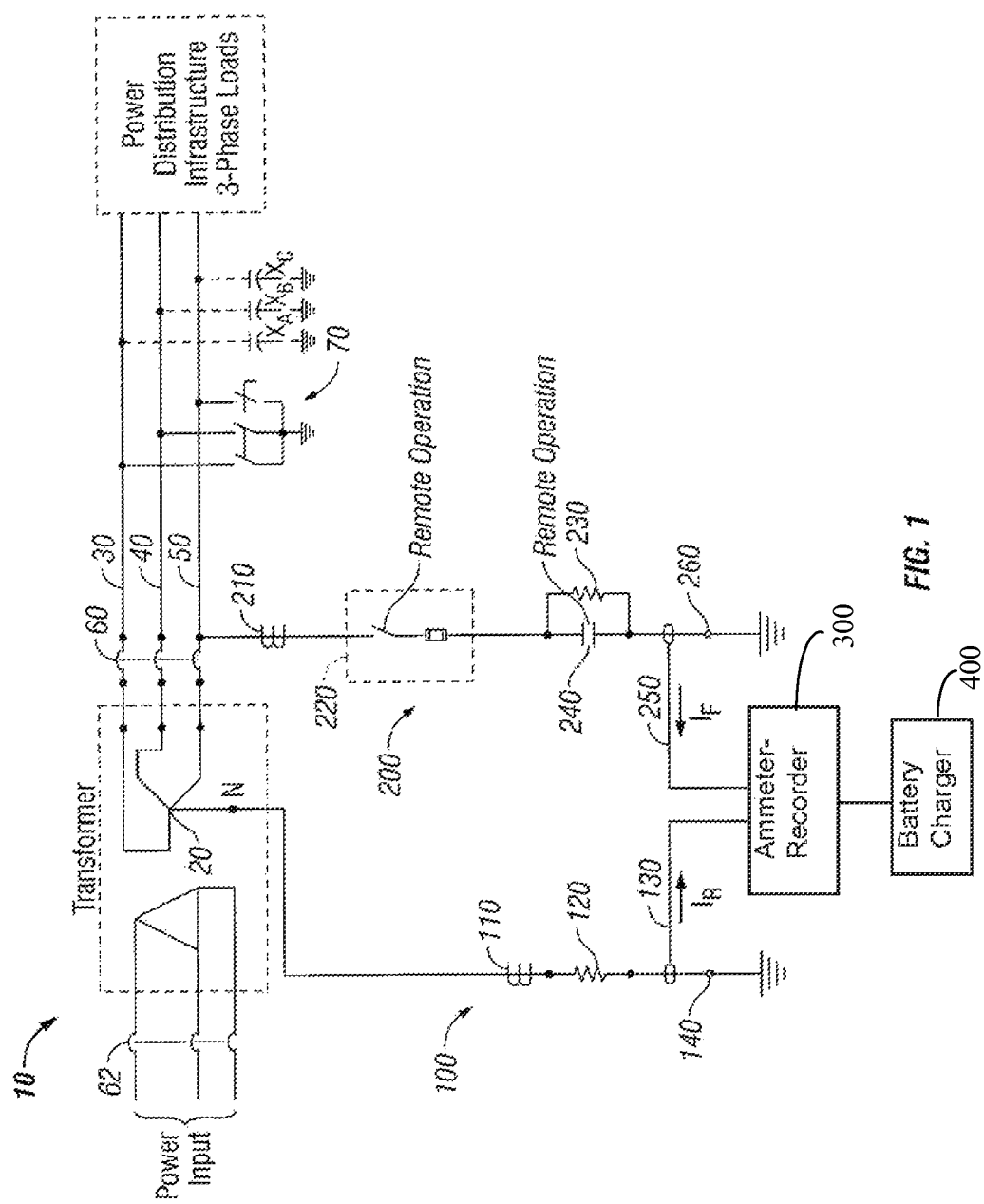
FIG. 1 is an example electrical schematic diagram of a high resistance grounded three-phase system which is used to determine charging current of the system.

System charging current of the three-phase power system circuit 10 described and illustrated in FIG. 1 may be determined and recorded using the present method described below. The three-phase power feeder circuit 10 may have a first grounding circuit 100 interconnected with its neutral 20. The first grounding circuit 100 may have, in electrical series interconnection: a first remotely operated relay 110, a first resistor 120, a first interconnection 130 with an ammeter-recorder 300, and a first grounding electrode 140. A second grounding circuit 200 may be interconnected with any one of the three phases 30, 40, or 50 of the feeder circuit 10, and may have, in electrical series interconnection: a second remotely operated relay 210, an interrupter switch 220 which may be fused as shown, a second resistor 230 shunted across a contactor 240, a second interconnection 250 with the ammeter-recorder 300, and a second grounding electrode 260. As shown in FIG. 1, feeder circuit 10 may have a three-phase secondary circuit breaker 60 and a three-phase capacitance discharging disconnect switch 70.

Figure 2:
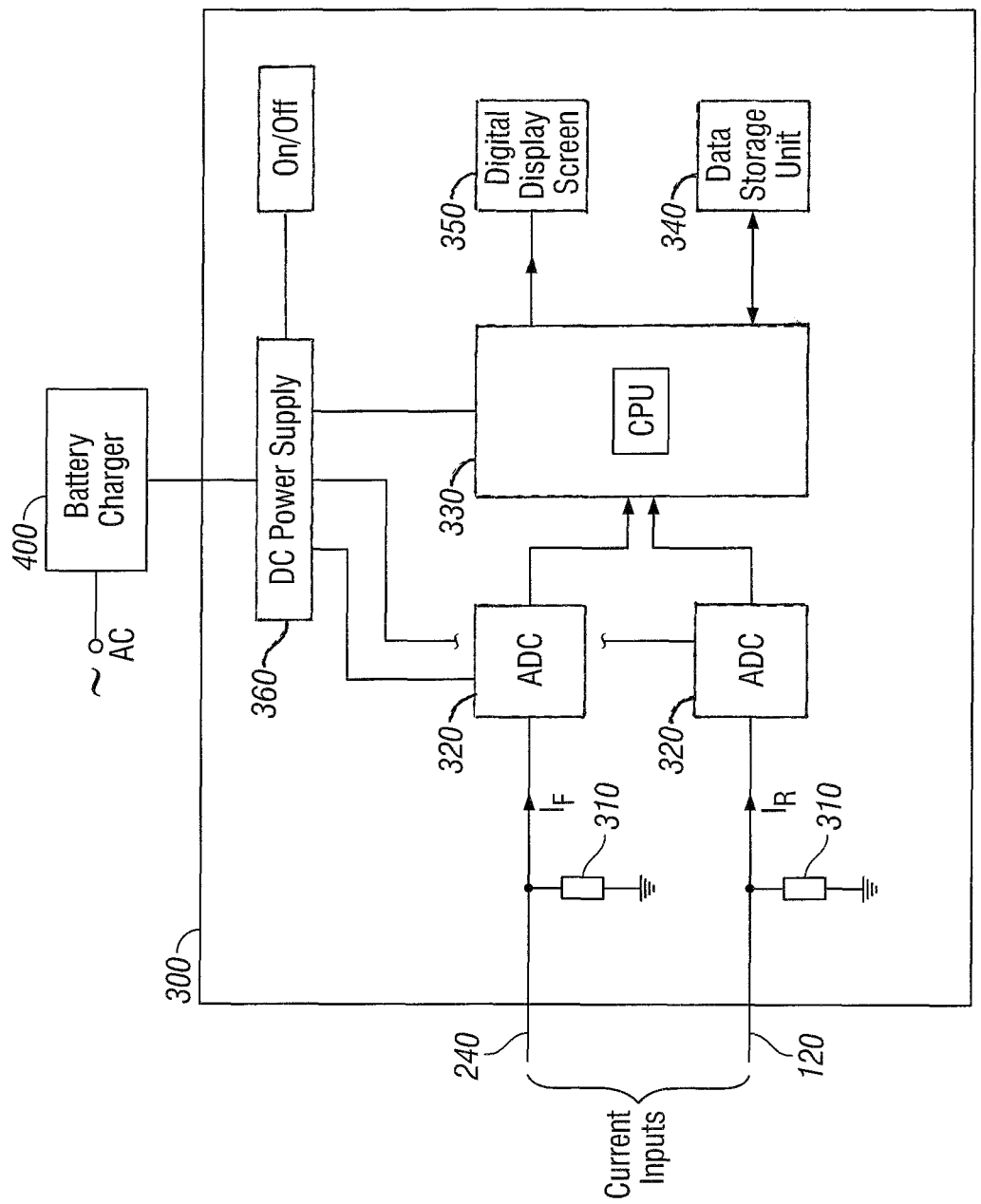
FIG. 2 is an example block diagram showing components of an ammeter-recorder used with the system.

As shown in FIG. 2, the ammeter-recorder 300 may have; in series electrical interconnection, separately with each of the first 130 and the second 250 ammeter-recorder interconnections: a low-pass filter 310 to ground, an analog-to-digital signal converter 320, and a programmable logic device 330 which may share signal paths with a data storage unit 340 and a digital display screen 350. The ammeter-recorder 300 may further have a manually actuated DC power supply battery 360 interconnected for providing power to the low pass filters 310, the signal converters 320, the programmable logic device 330, the storage unit 340 and the display screen 350. A DC power supply battery charger 400 may be interconnected with the DC power supply battery 360 for recharging service.

In the system described above, the method of determining and recording system charging current may include a procedure including selecting a value of the first resistor 120 in the first grounding circuit 100 which, as said, joins the neutral 20 of the feeder circuit 10 with ground (earth) via the first grounding electrode 140. The initial step of the method includes de-energizing the entire system typically by opening the primary circuit breaker. Next, residual charge on phase cables are discharged by closing a system three-phase switch 70 to ground. After opening this switch, the system is re-energized by closing the primary circuit breaker. With the second ground circuit 200 connecting a selected one phase to ground as shown in FIG. 1. The phase capacitance voltage is bleed-off, through the second resistor 220 in the second grounding circuit 200 which, as shown in FIG. 1, joins the phase 50 to ground (earth). Finally, the magnitude of currents in the first 100 (IR) and in the second 200 (IF) grounding circuits are measured when the interconnected phase, (phase 50 in FIG. 1) is short circuited to ground through contactor 240. A preliminary system charging current is calculated as the root of the difference between the squares of the current magnitude in the second grounding circuit and the first grounding circuit. The mathematical equation is:

$$I_C = \sqrt{(I_F^2 - I_R^2)}$$

This same procedure may be repeating for each of a plurality of different values of the first resistor 120, wherein a net system charging current is calculated as an average of the preliminary system charging currents. The same averaging approach may be used after calculating the preliminary system charging currents for each phase 30, 40 and 50. Obviously, it is also possible to calculate and determine the system charging current by determining the preliminary system charging current for each of a set of differing values of resistor 120 for each of the phases 30, 40, and 50 and then determine the net system charging current by averaging the results for each phase as an average of the results for a plurality of values of resistor 120. Different values of first resistor 120 that will provide the ratio $I_F/I_R$ equal to or less than 1.414 but greater than 1.275 will be suitable for transformer grounding to make a HR grounded power system.

Embodiments of the subject apparatus and method have been described herein. Nevertheless, it will be understood that various modifications may be made without departing from the spirit and understanding of this disclosure. Accordingly, other embodiments and approaches are within the scope of the following claims.

What is claimed is:

1. A three-phase power system circuit comprising:
  a first grounding circuit interconnected with a neutral of a power transformer, the first grounding circuit having in electrical series interconnection:
    a fixed resistor,
    a first ammeter-recorder interconnection, and
    a first grounding electrode;
  a second grounding circuit interconnected with one phase of a feeder circuit, the second grounding circuit having in electrical series interconnection:
    an interrupter switch,
    a shunting resistor across a circuit contactor,
    a second ammeter-recorder interconnection, and
    a second grounding electrode, and
  wherein an ammeter-recorder has in series electrical interconnection with each of the first and the second ammeter-recorder interconnections:
    a low-pass filter to ground,
    an analog-to-digital signal converter, and
    a programmable logic device operably connected with a data storage unit and/or a digital display screen.

2. The circuit of claim 1, wherein the first grounding circuit has a remotely operated relay.

3. The circuit of claim 1, wherein the feeder circuit further comprises a three-phase secondary circuit breaker and a three-phase capacitance discharging disconnect switch.

4. The circuit of claim 1, wherein the ammeter-recorder further has a manually actuated DC power supply battery interconnected for providing power to the signal converters, the programmable logic device, the storage unit and the display screen.

5. The circuit of claim 4, further comprising a DC power supply battery charger interconnected with the DC power supply battery for recharging the battery.

6. A three-phase power system circuit comprising:
  a first grounding circuit interconnected with a neutral of a power transformer, the first grounding circuit having in electrical series interconnection:
    a fixed resistor in series with a remotely operated relay,
    a first ammeter-recorder interconnection, and
    a first grounding electrode;
  a second grounding circuit interconnected with one phase of a feeder circuit, the second grounding circuit having in electrical series interconnection:
    an interrupter switch,
    a shunting resistor across a circuit contactor,
    a second ammeter-recorder interconnection, and
    a second grounding electrode, and
  wherein an ammeter-recorder has in series electrical interconnection with each of the first and the second ammeter-recorder interconnections:
    a low-pass filter to ground,
    an analog-to-digital signal converter, and
    a programmable logic device operably connected with a data storage unit and/or a digital display screen.

7. A method of determining and recording system charging current in a three-phase power system, the method comprising the steps of:
  selecting a value of a first resistor in a first grounding circuit joining a neutral of a power transformer with a ground;
  de-energizing the system;
  discharging residual system charge to ground;
  re-energizing the system;
  bleeding-off a charged capacitance voltage in one phase of the power system through a second resistor in a second grounding circuit joining the one phase of the power system with the ground;
  measuring a magnitude of current in the first and in the second grounding circuit when the one phase is short circuited to the ground; and
  calculating a preliminary system charging current as the root of the difference between the square of the current magnitude in the second grounding circuit and the square of the current magnitude in the first grounding circuit.

8. The method of claim 7, further comprising repeating the method of claim 7 for each of a plurality of different values of the first resistor, wherein a net system charging current is calculated as an average of the preliminary system charging currents determined for the plurality of first resistor values.

9. The method of claim 7, further comprising repeating the method of claim 7 for each phase of the three-phase power feeder circuit, wherein a net system charging current is calculated as an average of the preliminary system charging currents determined for the three phases.

* * * * *